(12) United States Patent
Nakabayashi et al.

(10) Patent No.: US 9,497,824 B2
(45) Date of Patent: Nov. 15, 2016

(54) LIGHT-EMITTING DEVICE

(71) Applicant: NICHIA CORPORATION, Anan-shi (JP)

(72) Inventors: Takuya Nakabayashi, Tokushima (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/870,007

(22) Filed: Sep. 30, 2015

(65) Prior Publication Data

US 2016/0095184 A1 Mar. 31, 2016

(30) Foreign Application Priority Data

Sep. 30, 2014 (JP) .................. 2014-200532

(51) Int. Cl.
*H01L 33/50* (2010.01)
*H01L 33/60* (2010.01)
*H05B 33/22* (2006.01)
*F21V 13/08* (2006.01)

(52) U.S. Cl.
CPC ............... *H05B 33/22* (2013.01); *F21V 13/08* (2013.01)

(58) Field of Classification Search
CPC ............................... H05B 33/22; F21V 13/08
See application file for complete search history.

(56) References Cited

U.S. PATENT DOCUMENTS

| 8,278,821 | B2 | 10/2012 | Ishida et al. | |
| 2012/0056525 | A1* | 3/2012 | Ishida | H05B 33/14 |
| | | | | 313/503 |
| 2013/0208442 | A1* | 8/2013 | Reiherzer | F21K 9/56 |
| | | | | 362/84 |
| 2014/0221539 | A1* | 8/2014 | Hong | C08K 3/22 |
| | | | | 524/135 |
| 2015/0003053 | A1* | 1/2015 | Ariyoshi | F21K 9/17 |
| | | | | 362/223 |
| 2015/0125979 | A1 | 5/2015 | Kwak et al. | |

FOREIGN PATENT DOCUMENTS

| JP | 2002-353507 | 12/2002 |
| JP | 2004/096113 | 3/2004 |
| JP | 2007-019096 | 1/2007 |
| JP | 2010-087292 | 4/2010 |
| JP | 2012-059824 | 3/2012 |

* cited by examiner

*Primary Examiner* — Donald Raleigh
(74) *Attorney, Agent, or Firm* — Mori & Ward, LLP

(57) ABSTRACT

A light-emitting device includes a base, a light-emitting element, a wavelength conversion member, and a light reflecting member. The base has a base upper surface. The light-emitting element is provided on the base and includes a semiconductor layer, a light transmissive substrate, and a recess. The semiconductor layer is provided on the base so that a semiconductor lower surface faces the base upper surface of the base. The light transmissive substrate has a substrate upper surface, a substrate lower surface opposite to the substrate upper surface, and a substrate side surface between the substrate upper surface and the substrate lower surface. The light transmissive substrate is provided on the semiconductor layer so that the substrate lower surface contacts a semiconductor upper surface of the semiconductor layer. The recess is provided on the substrate upper surface of the light transmissive substrate. The wavelength conversion member is provided in the recess.

16 Claims, 7 Drawing Sheets

LIGHT-EMITTING DEVICE

CROSS-REFERENCE TO RELATED APPLICATIONS

The present application claims priority under 35 U.S.C. §119 to Japanese Patent Application No. 2014-200532, filed Sep. 30, 2014. The contents of this application are incorporated herein by reference in their entirety.

BACKGROUND

1. Technical Field

The present disclosure relates to a light-emitting device.

2. Discussion of the Background

A light-emitting device in which with a light-emitting element emitting a blue light, and a phosphor material excited by partially absorbing the blue light and emitting a light having a longer wavelength, so that a white light is emitted has been proposed. A patent document (Japanese Unexamined Patent Application Publication No. 2007-19096, for example) discloses a light-emitting device in which a side surface of a light-emitting element and an element mounting portion are covered with a light reflecting layer.

SUMMARY OF THE INVENTION

According to one aspect of the present invention, a light-emitting device includes a base, a light-emitting element, a wavelength conversion member, and a light reflecting member. The base has a base upper surface. The light-emitting element is provided on the base and includes a semiconductor layer, a light transmissive substrate, and a recess. The semiconductor layer has a semiconductor upper surface and a semiconductor lower surface opposite to the semiconductor upper surface. The semiconductor layer is provided on the base so that the semiconductor lower surface faces the base upper surface of the base. The light transmissive substrate has a substrate upper surface, a substrate lower surface opposite to the substrate upper surface, and a substrate side surface between the substrate upper surface and the substrate lower surface. The light transmissive substrate is provided on the semiconductor layer so that the substrate lower surface contacts the semiconductor upper surface of the semiconductor layer. The recess is provided on the substrate upper surface of the light transmissive substrate. The wavelength conversion member is provided in the recess. The light reflecting member is provided to cover the substrate side surface of the light transmissive substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
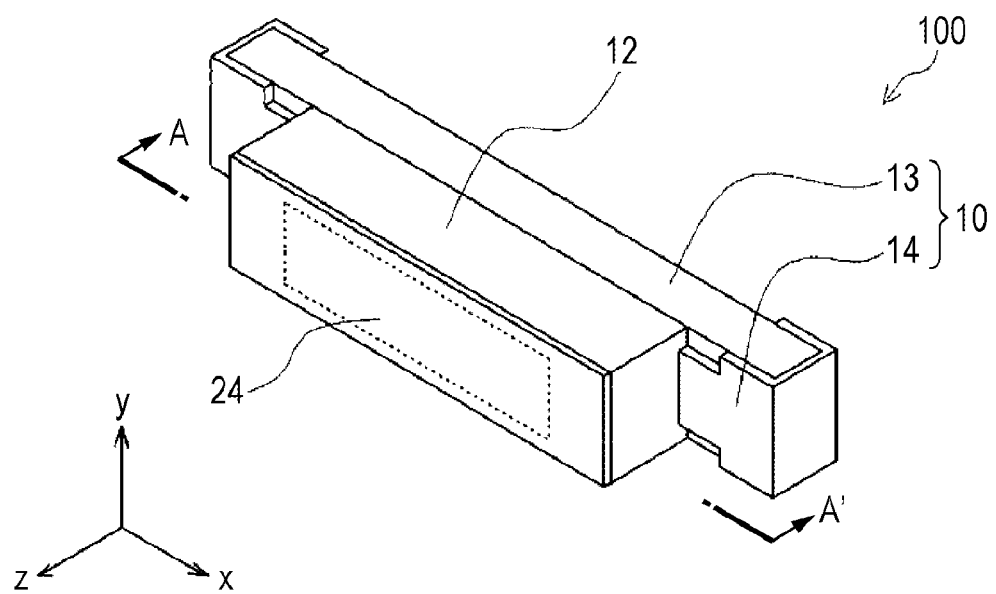
FIG. 1 is a schematic perspective view of a light-emitting device according to a first embodiment.

The embodiments will now be described with reference to the accompanying drawings, wherein like reference numerals designate corresponding or identical elements throughout the various drawings.

Hereinafter, embodiments of the present disclosure will be described with reference to the drawings occasionally. However, a light-emitting device in the following description is provided to embody a technical idea of the present disclosure, and the present disclosure is not limited to the following light-emitting device unless otherwise noted. In addition, the contents described in one embodiment and one example can be applied to another embodiment and another example.

A size and a positional relationship of each member shown in the drawing are sometimes exaggerated to make clear the description. In addition, directions x, y, and z in the drawing are also referred to as a lateral direction, a perpendicular direction, and a vertical direction or height (thickness) direction, respectively.

The light-emitting device according to the embodiments of the present disclosure is a side-view type light-emitting device in which a surface adjacent to a light extraction surface serves as a mounting surface, but it can be applied to a top-view type light-emitting device in which a surface opposed to the light extraction surface serves as the mounting surface.

This light-emitting device includes at least a base member ("a base member" is also referred to as "a base") having a pair of connection terminals and a base material, a light-emitting element, a light reflecting member, and a wavelength conversion member.

For ease of explanation of the side-view type light-emitting device, in this specification, the light extraction surface of the light-emitting device is referred to as an upper surface, surfaces adjacent to or meeting the light extraction surface are referred to as side surfaces, and one of the side surfaces is referred to as the mounting surface of the light-emitting device. Along with this, among surfaces of components or members in the light-emitting device, the surface corresponding to the light extraction surface of the light-emitting device is sometimes referred to as a first main surface or a front surface (that is, an upper surface), a surface opposite to the first main surface is sometimes referred to as a second main surface (that is, a lower surface), and a surface adjacent to or meeting the first main surface and the second main surface (that is, a surface corresponding to the side surface of the light-emitting device) is sometimes referred to as an end surface.

Base Member

The base member includes the base material, and one pair of connection terminals formed at least on the first main surface of the base material so as to face positive and negative electrodes. A shape of the base member is not limited in particular, but the shape of the base member may correspond to a shape of the base material which will be described below. For example, at least the first main surface preferably has a long-side direction and a short-side direction intersecting with or perpendicular to the long-side direction.

Base Material

A coefficient of linear expansion of the base material is preferably within ±10 ppm/° C. of a coefficient of linear expansion of the light-emitting element which will be described below, and more preferably within ±9 ppm/° C., ±8 ppm/° C., ±7 ppm/° C., and ±5 ppm/° C. thereof. Thus, it is possible to effectively prevent the light-emitting element from being removed from the base member (connection terminal) or to prevent a stress from being applied to the light-emitting element due to a difference in coefficient of linear expansion between the light-emitting element and the base member when the light-emitting element is mounted on the base member. As a result, the electrode of the light-emitting element can be directly connected to the connection terminal of the base member by flip chip bonding, so that a small and thin type light-emitting device can be provided.

Here, the coefficient of linear expansion means a value measured by a TMA method. It is preferable that $\alpha 1$ or $\alpha 2$ is included in this range, but more preferably both of $\alpha 1$ and $\alpha 2$ are included.

Examples of the base material include metal, ceramic, resin, dielectric material, pulp, glass, paper, a composite material of the above materials (such as composite resin), and a composite material of the above material and an electrically-conductive material (such as metal or carbon). Examples of the metal include copper, iron, nickel, chrome, aluminum, silver, gold, titanium, and alloy of these materials. The ceramic includes aluminum oxide, aluminum nitride, zirconium oxide, zirconium nitride, titanium oxide, titanium nitride, and mixture of these materials. The composite resin includes glass epoxy resin.

Particularly, the base material preferably contains the resin.

The resin may be any resin it is used in this field. Particularly, it is preferable to use the resin having a small coefficient of linear expansion enough to be within ±10 ppm/° C. of the coefficient of linear expansion of the light-emitting element.

More specifically, examples of the resin include epoxy resin, bismaleimide triazine (BT) resin, polyimide resin, cyanate resin, polyvinyl acetal resin, phenoxy resin, acrylic resin, alkid resin, and urethane resin.

In addition, a thermal emissivity of the resin is preferably 0.5 or more, and more preferably 0.6 or more. Such thermal emissivity allows heat from the light-emitting element to be efficiently released, so that the lifetime of the light-emitting device can be improved. The thermal emissivity is defined to be a value measured by thermal emissivity measuring device (such as TSS-5X produced by JAPAN SENSOR CORPORATION).

The resin preferably contains a filler such as a filler of an inorganic material so that the coefficient of linear expansion of the base material is ±10 ppm/° C. of the coefficient of linear expansion of the light-emitting element, or so that the thermal emissivity is increased. By appropriately combining a kind and an amount of the filler, the coefficient of linear expansion of the base material can be adjusted.

Examples of the filler or the inorganic material include borate particles covered with hexagonal boron nitride, alumina, silica (such as natural silica or molten silica), metal hydrate (such as aluminum hydroxide, boehmite, or magnesium hydroxide), a molybdenum compound (such as molybdenum oxide), zinc borate, zinc stannate, aluminum oxide, clay, kaolin, magnesium oxide, aluminum nitride, silicon nitride, talc, calcined clay, calcined kaolin, calcined talc, mica, short glass fiber (such as glass fine powder of E glass, or D glass, or glass cloth), hollow glass, heat-shrinkable filler such as zirconium phosphate, rubber powder, and core-shell type rubber powder (such as styrene-based, butadiene-based, acrylic-based, or silicone).

Particularly, using the resin containing a large amount of the filler or the inorganic material having a high thermal conductivity allows for adjusting the thermal emissivity. For example, in the case of using glass cloth, the inorganic material content in the glass cloth can be 50 wt. % or more, 70 wt. % or more, or 90 wt. % or more.

The resin may contain a pigment to adjust a color of the base material. Examples of the pigment includes carbon black, and white titanium oxide.

As for the light-emitting device which is small in size, the light-emitting element itself is relatively large in size with respect to the light-emitting device, so that the light-emitting device could be excessively heated by heat generated from the light-emitting element or Stokes heat from the phosphor. This heat may cause undesirable effects such as deterioration or deformation of a light guide plate in a backlight. Thus, in the case where the base material (resin) contains the black material such as carbon black having the high heat emissivity, the heat from the light-emitting element and the phosphor can be released.

A plan view shape of the base material includes a circle, polygon such as quadrangle, and a shape similar to them. Among them, it is preferable that the plan view shape is substantially an oblong quadrangle, that is, a shape having a narrow width and a long length. The base material is preferably larger in planar area than the light-emitting element which will be described below. In the case where the one light-emitting element is mounted in the one light-emitting device, the light-emitting device preferably has a long-side length which is 1.5 times to 5 times, and more preferably 1.5 times to 3 times as long as one side of the light-emitting element. In addition, the light-emitting device preferably has a short-side length which is 1.0 time to 2.0 times, and more preferably 1.1 times to 1.5 times as long as one side of the light-emitting element. In the case where the plurality of light-emitting elements are mounted in the one light-emitting device, the length of the light-emitting device can be appropriately adjusted depending on the number of the light-emitting elements. For example, in the case where the two or three light-emitting elements are mounted in the long-side direction, the long-side length is preferably 2.4 times to 6.0 times or 3.5 times to 7.0 times as long as one side of the light-emitting element.

One or more layers composed of an insulator or metal to reinforce the surface, release the heat, and provide a mark for alignment can be provided on the second main surface of the base material.

Connection Terminal

The pair of the connection terminals may be formed at least on the first main surface of the base member. In this case, at least one part of an edge portion of the connection terminal preferably aligns with one part of an edge portion of the first main surface of the base member. In other words, it is preferable that the one part of the end surface of the connection terminal and the one part of the mounting surface of the base member are formed on a same plane. Thus, when the light-emitting device is mounted on a mounting substrate, the mounting substrate and the end surface of the connection terminal can be in contact with each other (or infinitely close to each other). As a result, mountability of the light-emitting device can be improved. Here, the same plane means that there is no or almost no step difference, but a small irregularity of several μm to several dozen μm is allowed. In this specification, the term "the same plane" has the same meaning in the following description.

The connection terminal has an element connection portion to be connected to the electrode of the light-emitting element, and an external connection portion to be connected to an outside of the light-emitting device, on the first main surface. The external connection portion is preferably provided on the second main surface of the base member in addition to on the first main surface of the base member.

For example, the connection terminal is preferably (i) provided from the first main surface to the surface existing between the first main surface and the second main surface, (ii) provided from the first main surface to the second main surface through a via or through hole provided so as to penetrate the base material, or (iii) provided from the first main surface to the second main surface through the surface existing between the first main surface and the second main surface (in a shape of U in a cross-sectional view, for example). Here, the surface existing between the first main surface and the second main surface may mean one portion or a whole portion of the end surface existing between the first main surface and the second main surface, or mean one portion or a whole portion of the two or more end surfaces existing between the first main surface and the second main surface.

The element connection portion can be disposed on the first main surface, and the external connection portion is disposed (i) on the first main surface, (ii) on the first main surface and the end surface, (iii) on the first main surface, the end surface, and the second main surface, or (iv) on the first main surface and the second main surface.

The connection terminal may not be a uniformed width (the short-side length of the base member, for example) over the first main surface, the end surface and/or the second main surface of the base member, and the width may be partially reduced or increased. As another configuration, the connection terminal may be partially covered with an insulating material (such as the base material) so that the width is reduced, on the first main surface and/or the second main surface of the base member. The portion having the reduced width is preferably disposed at least on the first main surface of the base member, or may be disposed on both of the first main surface and the second main surface. Particularly, the portion having the reduced width is more preferably disposed in the vicinity of the light reflecting member which will be described below, on the first main surface of the base member.

Providing with the portion having the reduced width allows for preventing a bonding member or the like, which will be described below and to be connected to the connection terminal, or flux contained in the bonding member from intruding under the light reflecting member which will be described below, and further under the light-emitting element along a terminal surface.

In addition, spacing the connection terminal apart from the end surface of the base member along the long-side direction allows for preventing the flux intrusion similarly to the above when the light-emitting element is mounted.

The portion having the reduced width is preferably narrower than the element connection portion. In addition, the portion having the reduced width is preferably gradually reduced in width.

The base member may further include a heat releasing terminal, a heat sink, and a reinforcing member other than the connection terminal electrically connected to the light-emitting element. These may be disposed on any of the first main surface, the second main surface, and the end surface, and particularly it is preferable to be disposed below the light-emitting element and/or the light reflecting member. Thus, the strength and reliability of the light-emitting device can be enhanced. In addition, enhancing the strength of the base member allows, a distortion of the base member can be reduced, and thus molding performance of the light reflecting member can be improved, in the case where the light reflecting member is formed by a mold.

In the case where the heat releasing terminal or the reinforcing terminal is electrically conductive, and disposed between the pair of connection terminals, the heat releasing terminal or a reinforcing terminal is preferably covered with an insulating film. Thus, the bonding member can be prevented from forming a bridge between the connection terminal and the heat releasing terminal or the reinforcing terminal.

Furthermore, in the case where the plurality of light-emitting elements are disposed in the one light-emitting device, one or more connection terminals may be provided to electrically connect between the light-emitting elements. The shape and the position of the connection terminal may be appropriately set, according to the number, an arrangement, and a connecting condition (in parallel or in series) of the light-emitting elements to be mounted on the one base member.

The connection terminal may be a single-layer film or a stacked-layer film made of Au, Pt, Pd, Rh, Ni, W, Mo, Cr, Ti, Fe, Cu, Al, Ag, or alloy of them. Among them, the preferable material is of be superior in electric conductivity and mountability, and the more preferable material is of be good in bonding performance and wettability with the bonding member provided on the mounting side. Particularly, in view of the heat releasing performance, copper or copper alloy is preferable. The surface of the connection terminal may be covered with a film having high light reflectivity and being a single-layer film or a stacked-layer film made of silver, platinum, tin, gold, copper, rhodium, or alloy of them, or the like. More specifically, the connection terminal may have a stacked-layer structure made of W/Ni/Au, W/Ni/Pd/Au, W/NiCo/Pd/Au, Cu/Ni/Cu/Ni/Pd/Au, Cu/Ni/Pd/Au, Cu/Ni/Au, Cu/Ni/Ag, Cu/Ni/Au/Ag, or the like. In addition, a thickness or the number of the stacked layers may be partially varied.

The connection terminal may be approximately flat or may have a protrusion or a recess on the surface connected to the light-emitting element, that is, on the first main surface. For example, the connection terminal may have a projecting pattern in the position facing the electrode of the light-emitting element which will be described below. The projecting pattern is preferably as large as the electrode of the light-emitting element. In addition, the connection terminal and the projecting pattern are preferably horizontal with respect to the surface of the base member (the surface connected to the light-emitting element) so that the light emission surface can be horizontally disposed after the light-emitting element is mounted on the base member. The projecting pattern may be formed by an etching method using photolithography such as additive method, semi-additive method, or subtractive method.

A wiring or a lead frame may be used for the connection terminal, but it is preferable to form a film by plating with the above-mentioned material in order to form the approximately flat surface on the base member surface or the same plane as the base member. A thickness of the connection terminal is several μm to several dozen μm. Particularly, the projecting pattern is preferably formed by laminating plated layers. A thickness of the projecting pattern is several μm to several dozen μm from the surface of the connection terminal in another portion.

The base member itself may serve as a protective element such as a capacitor, varistor, zener diode, or bridge diode, or may partially include a structure having functions of these elements, for example, in the form of a multilayer structure or a stacked-layer structure. By using the base member having such functions, the light-emitting device can serve as such member without an additional component. As a result, a high-performance light-emitting device in which electrostatic withstand voltage is improved can be further miniaturized.

Light-Emitting Element

The light-emitting element is mounted on the base member, and connected to the connection terminal on the first main surface of the base member.

One light-emitting element or two or more light-emitting elements may be mounted on the one light-emitting device. A size, a shape, and a light emission wavelength of the light-emitting element can be appropriately selected. In the case where the plurality of light-emitting elements are mounted, they may be disposed irregularly, or regularly or periodically like a matrix. The plurality of light-emitting elements may be connected in series, parallel, series-parallel, or parallel-series.

The light-emitting element includes at least a light transmissive substrate and a semiconductor layer. According to this embodiment, the light transmissive substrate may be a growth substrate to grow the semiconductor layer, or may be a substrate which does not serve as the growth substrate. That is, the light transmissive substrate which has been separately bonded after the growth substrate has been removed is also referred to as the light transmissive substrate here.

The semiconductor layer is preferably a nitride semiconductor stacked body. The nitride semiconductor stacked body is formed by stacking a first semiconductor layer (such as an n-type semiconductor layer), an active layer, and a second semiconductor layer (such as a p-type semiconductor layer) in this order, for example, and contributes to light emission. A thickness of the nitride semiconductor stacked body is preferably 30 μm or less, and more preferably 15 μm or less, or 10 μm or less.

In addition, a first electrode (positive or negative) electrically connected to the first semiconductor layer, and a second electrode (negative or positive) electrically connected to the second semiconductor layer are preferably both provided on a same surface of the nitride semiconductor laminated body (such as a surface of the second semiconductor layer). The first electrode and the second electrode may include an ohmic electrode, metal film, and external connection electrode.

The kinds and the materials of the first semiconductor layer, the light-emitting layer, and the second semiconductor layer are not limited in particular, and include various semiconductors such as the group III-V based semiconductor, and group II-VI based semiconductor. More specifically, a nitride-based semiconductor material such as $In_XAl_YGa_{1-X-Y}N$ ($0 \leq X$, $0 \leq Y$, $X+Y<1$) may be used, and InN, AlN, GaN, InGaN, AlGaN, and InGaAlN may be used. A thickness of each layer and a structure of the layers may be the known ones in this field.

The nitride semiconductor stacked body may be stacked on the light transmissive substrate for growing the semiconductor layer.

The light transmissive substrate for growing the semiconductor layer includes the one capable of epitaxially growing the semiconductor layer. The light transmissive substrate includes an insulating substrate made of sapphire ($Al_2O$) or spinel ($MgAl_2O_4$), and the above-mentioned nitride-based semiconductor substrate. A thickness of the light transmissive substrate is preferably 50 μm to 200 μm.

The light transmissive substrate has a recess in its upper surface for disposing the light reflecting member.

The one recess or two or more recesses may be formed in the upper surface of the light transmissive substrate. A depth of the recess is preferably 30 μm to 150 μm, and more preferably 30 μm to 70 μm.

The recess may be formed into a desired shape such as quadrangle, circle, or shape similar to the light transmissive substrate. An inner side surface of the recess may be inclined to widen upward, or inclined to narrow upward.

The recess can be formed by using a method such as laser processing, blasting, dicing, or etching. Particularly, the laser processing or etching is preferably used because the recess can be formed into shape having inclined inner surface with high precision.

In addition, the semiconductor layer may be grown on the growth substrate which has a recess in a surface opposite to the growth surface, or a light transmissive substrate having a recess may be laminated to a semiconductor layer which has been removed from the growth substrate. The recess may be formed in a stage in which the light-emitting element is formed in a wafer, or formed after the light-emitting element is mounted on the base member. In the case where the recess is formed after the light-emitting element is mounted, it may be formed before the light reflecting member is provided, or formed after the side surface of the light-emitting element is covered with the light reflecting member.

The light transmissive substrate may have a plurality of protrusions, or irregularities in the surface opposite to the surface having the recess, that is, the surface serving as the growth surface of the semiconductor layer. In addition, in accordance with this, a plurality of protrusions or irregularities may be formed in the surface of the nitride semiconductor stacked body facing the light transmissive substrate (that is, the surface of the nitride semiconductor laminated body opposite to the surface having the electrodes). The irregularities of the surface of the nitride semiconductor stacked body may formed according to the shape of the light transmissive substrate, and may have surface roughness in which its height is about 0.5 μm to 2.0 μm, and its pitch is about 10 μm to 25 μm.

The light transmissive substrate may have an off angle of about 0° to 10° with respect to a predetermined crystal plane such as C plane or A plane.

The light transmissive substrate may have a semiconductor layer or an insulating layer such as an intermediate layer, buffer layer, or base layer between the light transmissive substrate and the first semiconductor layer.

In addition, the light-emitting element may have a stacked-layer structure such as a vertical structure or laminated structure. That is, for example, a stacked-layer structure disclosed in Japanese Unexamined Patent Application Publication No. 2008-300719, or Japanese Unexamined Patent Application Publication No. 2009-10280 can be used.

The shape of the light-emitting element in the planar view is not limited in particular, and it is preferably a quadrangular shape or shape similar to this. The size of the light-emitting element can be appropriately adjusted according to a size of the light-emitting device. For example, a length of one side of the light-emitting element includes several hundred µm to 2 mm, and preferably 1400 µm×200 µm, 1100 µm×200 µm, or 900 µm×200 µm in plan view.

The side surface and upper surface of the light-emitting element are preferably high in linearity having no undulation and no indentation. Thus, the light-emitting element can be prevented from being cracked by very small external force due to the undulation and indentation. For example, the surface roughness Ra of the upper surface of the light-emitting element is preferably 15 nm or less, such as 10 nm to 15 nm. The surface roughness Ra of the side surface of the light-emitting element is preferably 2 µm or less, and more preferably 1.0 µm or less, or 0.5 µm or less. Particularly, the surface roughness Ra of the side surface of the light-emitting element is preferably 0.3 µm or less, and more preferably 0.2 µm or less. The surface roughness Ra is a value measured by a method according to JIS B060 or '01/ISO4287.

First Electrode and Second Electrode

The first electrode and the second electrode are preferably formed on the same surface of the semiconductor laminated body (surface opposite to a surface, the surface facing the substrate in the case where the substrate is provided). Thus, the light-emitting element can be mounted on the base member in a flip chip manner, in which the first electrode and the second electrode of the light-emitting element can be faced to and mounted to the positive and negative connection terminals of the base member, respectively.

Each of the first electrode and the second electrode can be a single-layer film or a stacked-layer film made of Au, Pt, Pd, Rh, Ni, W, Mo, Cr, Ti or alloy of them. More specifically, Each of the first electrode and the second electrode may include a stacked-layer film such as Ti/Rh/Au, W/Pt/Au, Rh/Pt/Au, W/Pt/Au, Ni/Pt/Au, or Ti/Rh stacked from the semiconductor layer side. Its film thickness may be any film thickness used in this field.

The thickness of the light-emitting element including the electrode is preferably 150 µm or less, and more preferably 100 µm or less.

The light-emitting element may have a reinforcing layer disposed on the surface of the nitride semiconductor stacked body, the surface facing the positive and negative electrodes. Here, the reinforcing layer may be made of any material such as an insulator, semiconductor, or conductor as long as it can reinforce the strength of the nitride semiconductor stacked body. The reinforcing layer may be a single layer or stacked layers as a whole, or a single layer or stacked layers disposed at several positions. In addition, the reinforcing layer may be a layer partially having insulating or electrically-conductive properties which are indispensable for the function of the light-emitting element. Particularly, the reinforcing layer may be provided by partially increasing the thickness of the film used to configure light-emitting element. More specifically, the electrically-conductive layer serving as an electrode or the like may be increased in thickness by the known method such as plating or sputtering. Alternatively, an interlayer insulating film or a surface protection film disposed between the electrically-conductive layers may be increased in thickness. Accordingly, an appropriate strength is ensured without an additional layer being disposed, the light-emitting device can be prevented from becoming too large.

For example, from one point of view, the reinforcing layer may be a layer which is provided closer to the base member than the positive and negative electrodes and does not serve as the nitride semiconductor laminated body and the positive and negative electrode used to configure the light-emitting element, and does not serve as an insulating layer formed between the nitride semiconductor laminated body and the positive and negative electrode to electrically insulate and protect them.

Furthermore, from another point of view, a layer essentially needed to serve as a light-emitting element can be increased in thickness so that the layer can be the reinforcing layer. Furthermore, a layer additionally provided to the layer mentioned above can serve as the reinforcing layer. In order to make these layers serve as the reinforcing layer, a whole volume of the layer composed of a metal material is preferably to be adjusted to be 5% to 95%, and more preferably 10% to 70%, or 15% to 50% with respect to a whole volume including the nitride semiconductor stacked body, the electrodes, the insulating protective film, and a resin layer fills between the electrodes, except for the substrate for growing the semiconductor layer.

Furthermore, from still another point of view, the reinforcing layer may be an electrically-conductive layer not connected to the electrode of the light-emitting element, an insulating layer to insulate this electrically-conductive layer from the electrode, and a protective layer to protect it. That is, the electrically-conductive layer, the insulating layer, and the protective layer can function as the reinforcing layer.

Each of these reinforcing layers preferably has a total thickness of 1 µm or more, and more preferably 3 µm or more, 5 µm or more, or 10 µm or more at the thinnest portion.

Including the reinforcing layer having the appropriate thickness allows for ensuring the strength of the light-emitting device, so that the increase in size and thickness can be minimized in the element.

The light-emitting element is mounted on the base member by flip chip bonding with the light transmissive substrate facing upward.

In this case, the first electrode and the second electrode can be bonded to the above-described connection terminal of the base member by the bonding member. The bonding member may be made of any known material in this field, and example thereof includes an electrically conductive bonding member. More specifically, examples of the material include solder of tin-bismuth-based, tin-copper-based, tin-silver-based, or gold-tin-based (such as alloy mainly containing Ag, Cu, and Sn, alloy mainly containing Cu and Sn, or alloy mainly containing Bi and Sn), eutectic alloy (such as alloy mainly containing Au and Sn, alloy mainly containing Au and Si, or alloy mainly containing Au and Ge), silver, gold, palladium as electrically-conductive paste or bump, anisotropically conductive material, and brazing material such as a low melting temperature metal. Among them, in the case of using the solder, according to the above-described shape of the connection terminal, and the position and the size of the projecting pattern, a high-precision self-alignment effect can be obtained. As a result, the light-emitting element can be easily mounted in an appropriate position, so that productivity can be improved, and the light-emitting device can be manufactured to be smaller. In the case where the growth substrate is removed, it is preferable to use an anisotropically conductive paste or anisotropically conductive film after mounting. The bonding member preferably has a thickness which is ¼ to 3 times, and more preferably 1 time to 3 times as thick as the nitride semiconductor laminated body when the light-emitting element is fixed to the connection terminal. Thus, a self-alignment effect with higher precision can be provided, and the size or thickness can be further reduced. For example, the thickness of the bonding member is preferably about 2 µm to 50 µm, and more preferably about 5 µm to 30 µm.

Light Reflecting Member

The light reflecting member seals (covers) at least a portion of the side surface of the light transmissive substrate of the light-emitting element. In addition, the light reflecting member preferably fix the light-emitting element to the base member. A material of the light reflecting member is not limited in particular as long as the light reflecting member can reflect the light from the light-emitting element. For example, the light reflecting member includes ceramics, resin, dielectric material, pulp, glass, or composite material of these. Among them, the resin is preferable because the resin can be easily formed into a desired shape.

Examples of the resin include a thermosetting resin, thermoplastic resin, modified resin of these, and a hybrid resin containing one or more kinds of these. More specifically, examples thereof include an epoxy resin composition, modified epoxy resin composition (such as silicone modified epoxy resin), silicone resin composition, modified silicone resin composition (such as epoxy-modified silicone resin), hybrid silicone resin, polyimide resin composition, modified polyimide resin composition, polyamide resin, polyethylene terephthalate resin, polybutylene terephthalate resin, polycyclohexane terephthalate resin, polyphthalamide (PPA), polycarbonate resin, polyphenylene sulfide (PPS), liquid crystal polymer (LCP), ABS resin, phenol resin, acrylic resin, PBT resin, urea resin, BT resin, and polyurethane resin.

A coefficient of linear expansion and a glass transition temperature of the resin used for the light reflecting member is not limited in particular, and for example, the coefficient of linear expansion is preferably about 100 ppm/° C. or less, and more preferably about 80 ppm/° C. or less, or about 60 ppm/° C. ppm/° C. or less, and the glass transition temperature is preferably 100° C. or less, and more preferably 75° C. or less, or 50° C. or less.

A reflectivity of the light reflecting member for the light from the light-emitting element is preferably 60% or more, and 70% or more, 80% or more, or 90% or more.

In order to achieve such reflectivity, it is preferable that the above material such as the resin contains a light reflecting material, light diffusing agent, or a coloring agent, such as titanium dioxide, silicon dioxide, zirconium dioxide, potassium titanate, alumina, aluminum nitride, boron nitride, mullite, niobium oxide, zinc oxide, barium sulfate, carbon block, and various rare earth oxides (such as yttrium oxide or gadolinium oxide).

The light reflecting member may contain a fiber filler of glass fiber, or wollastonite fiber, or inorganic filler of carbon, etc. In addition, the light reflecting member may contain a material having a high heat releasing property (such as aluminum nitride).

These additives may be preferably contained by 10% to 95% by weight, 20% to 80% by weight, or 30% to 60% by weight with respect to total weight of the light reflecting member.

Containing the light reflecting material allows the light from the light-emitting element to be efficiently reflected. Particularly, using a material having a light reflectivity higher than that of the base member (for example, using a silicon resin containing titanium dioxide as the light reflecting member in the case where the base member is made of aluminum nitride), the light extracting efficiency of the light-emitting device can be enhanced while handling performance can be maintained with the base member reduced in size. In the case where only titanium dioxide is contained as the light reflecting material, its content is preferably 20% to 60% by weight, and more preferably 30% to 50% by weight with respect to the total weight of the light reflecting member. In addition, a reflective layer such as a metal film may be formed on the surface of the above-mentioned materials on the light-emitting element side.

In addition, in the case where the light reflecting member is made of a material having a high heat releasing property, the heat releasing property can be improved while the light-emitting device keeps the small size.

The outer shape of the light reflecting member is not limited in particular, and it may be a circular column or polygonal column such as quadrangular column or a shape similar to these, truncated circular cone or truncated polygonal cone such as truncated quadrangular cone, or may be partially lens shape. Among them, the light reflecting member preferably has a shape which is long and thin in the long-side direction of the base member. In addition, the light reflecting member preferably has a surface in short-side direction of the base member.

The light reflecting member is preferably disposed so as to be partially or wholly in contact with at least the one side surface of the light-emitting element (that is, one surface of the light transmissive substrate and the semiconductor layer) to cover the side surface of the light-emitting element, and preferably disposed to be in contact with the light-emitting element so as to surround the whole periphery of the light-emitting element. In this case, the light reflecting member is preferably provided such that a thickness of the light reflecting member extending along the long-side direction of the light-emitting device is thinner than d a thickness of the light reflecting member extending in the short-side direction. Thus, the thin light-emitting device can be obtained.

In addition, the light reflecting member is preferably provided so as to fill a space between the mounted light-emitting element and the base member. Thus, the strength of the light-emitting device can be enhanced. The light reflecting member disposed between the light-emitting element and the base member may be made of a material different from the material which covers the side surface of the light-emitting element. Thus, the light reflecting member disposed on the side surface of the light-emitting element, and the member disposed between the light-emitting element and the base member can have the appropriate functions, respectively.

For example, the light reflecting member disposed on the side surface of the light-emitting element may be made of the material having a high reflectivity, and the member disposed between the light-emitting element and the base member may be made of a material to increase adhesiveness between the light-emitting element and the base member.

Particularly, the light reflecting member disposed between the light-emitting element and the base member is preferably made of a resin having a coefficient of liner expansion which is ±20% of the coefficient of linear expansion of the connection terminal. From another point of view, the light reflecting member is preferably made of a resin having a coefficient of linear expansion of 30 ppm/° C. or less, and more preferably 25 ppm/° C. or less. In addition, from still another point of view, its glass transfer temperature is 50° C. or less, and more preferably 0° C. or less. Thus, the light reflecting member can be prevented from being removed from the base member.

An edge portion of the light reflecting member in the plan view (plan view taken from the light extraction surface) may be disposed on an inner side or outer side of an edge portion of the base member. In the case where the plan view of the light reflecting member is a shape having long length and narrow width, its one edge portion along the long-side direction preferably aligns with the edge portion of the base member along the long-side direction. That is, at least one end surface of the light reflecting member extending along the long-side direction of the light reflecting member is preferably on the same plane as the one end surface of the base member extending along the long-side direction of the base member, and more preferably both end surfaces of these members are on the same plane, respectively. With this structure, an area of the light extraction surface can be increased without increasing the thickness of the light-emitting device, so that the light extraction efficiency can be enhanced. The edge portion of the light reflecting member along its short-side direction can be disposed on the inner side of the end portion of the base member along its short-side direction. Here, the term "the same plane" does not mean strictly the same plane, and in the case where the light reflecting member has a slightly round shape, the term "the same plane" also encompasses a case where the round shape partially aligns with the end surface of the base member.

The light reflecting member is preferably larger than the light-emitting element when taken from the light extraction surface. Particularly, its long-side length in an outermost shape is preferably 1.01 times to 4.0 times as long as the one side of the light-emitting element. More specifically, it is preferably 300 μm to 2000 μm, and more preferably 1000 vim to 1500 μm.

A thickness of the light reflecting member (a width from the end surface of the light-emitting element to the outermost of the light reflecting member, or a minimum width of the light reflecting member from the side surface of the light-emitting element when taken from the light extraction surface) is 1 μm to 1000 μm, and preferably 50 μm to 500 μm, or 100 μm to 200 μm.

The light reflecting member preferably has a height so that an upper surface of the light reflecting member is on the same plane as the upper surface of the light-emitting element when the light-emitting element is mounted on the base member.

The light reflecting member can be formed by screen printing, potting, transfer molding, or compression molding. In the case where a molding machine is used, a release film may be used.

The light reflecting member may be formed after the light-emitting element is mounted on the base member to seal (cover) the whole side surfaces of the light-emitting element, and the space between the light-emitting element and the base member. In addition, the light reflecting member may be provided so as to cover the upper surface or the side surface of the light-emitting element before the light-emitting element is mounted on the base member.

Wavelength Conversion Member

The wavelength conversion member is disposed in the recess formed in the upper surface of the light transmissive substrate. The wavelength conversion member preferably contains a phosphor and/or a quantum dot which are excited by light from the light-emitting element.

The phosphor and/or the quantum dot are preferably contained in a light transmissive member. In addition, the wavelength conversion member may contain two or more kinds of phosphors, two or more kinds of quantum dots, or both of phosphor and quantum dot.

The light transmissive member preferably transmits 60% or more of light emitted from the light emission layer, and more preferably transmits 70%, 80%, or 90% or more of the light. The member is preferably made of resin such as silicone resin, silicone-modified resin, epoxy resin, epoxy-modified resin, phenol resin, polycarbonate resin, acrylic resin, TPX resin, polynorbornene resin, or hybrid resin containing one or more of the above resins, or glass. Among them, the silicone resin or the epoxy resin is preferably used, and particularly the silicone resin is preferably used because it is superior in light resistance and heat resistance.

As the phosphor, a known phosphor in this field may be used. For example, yttrium-aluminum-garnet (YAG)-based phosphor activated with cerium, lutetium-aluminum-garnet (LAG) activated with cerium, nitrogen-containing calcium aluminosilicate ($CaO-Al_2O_3-SiO_2$)-based phosphor activated with europium and/or chrome, silicate (($Sr$, $Ba)_2SiO_4$)-based phosphor activated with europium, β-sialon phosphor, nitride-based phosphor such as CASN-based or SCASN-based phosphor, KSF-based phosphor ($K_2SiF_6$: Mn), and sulfide-based phosphor. Thus, the light-emitting device can emit color mixed light (such as white light) of a primary light and a secondary light having visible wavelengths, and the light-emitting device can emit a secondary light having a visible wavelength excited with a primary ultraviolet light. In the case where the light-emitting device is used in a backlight of a liquid crystal display, it is preferable to use a phosphor which is excited with a blue light and emits a red light (such as KSF-based phosphor), and a phosphor which emits green light (such as 3-sialon phosphor). Thus, a color reproduction range can be increased in the display with the light-emitting device. In the case where the light-emitting device is used in an illumination, an element which emits blue-green light can be used in combination with a red phosphor. In the case where the light-emitting device is used in a light source for the backlight of the liquid crystal display, a necessary amount of KSF-based phosphor in the light emitting device is larger than a necessary amount of CASN-based or SCASN-based phosphor in the light emitting device. Therefore, when the KSF-based phosphor is disposed in the recess, the thickness (z direction) of the light-emitting device can be reduced, which is preferable.

The phosphor preferably has a center particle diameter of 50 μm or less, 30 μm or less, or 10 μm or less. The center particle diameter can be measured and calculated by a commercially available particle measuring machine or particle distribution measuring machine. In addition, the above particle diameter means a particle diameter obtained by an air permeability method in Fisher Sub Sieve Sizer's No (F. S. S. S. No.).

The phosphor may be a light-emitting substance called nanocrystal or quantum dot. The material includes a semiconductor material such as group II-VI based, group III-V based, and group IV-VI based semiconductors, and more specifically, nano-size high dispersion particles of CdSe, core-shell type $CdS_xSe_{1-x}/ZnS$, or GaP. This phosphor has a particle diameter of 1 nm to 20 nm (10 atoms to 50 atoms). With this phosphor, internal scattering can be prevented, and light transmittance can be further improved. Preventing the internal scattering allows increasing light distribution components vertical to the upper surface, and the light toward the side surface or the lower surface of the light-emitting device can be reduced, so that the light extracting efficiency from the wavelength conversion member can be further improved. For example, when the phosphor is used for the backlight, light-incident efficiency to the backlight can be further improved.

The quantum dot may be surface-modified or stabilized with a resin of polymethyl methacrylate (PMMA).

The light transmissive member may further contain a filler (such as a diffusing agent, or coloring agent). For example, the light transmissive member includes a crystal or sintered body of silica, titanium oxide, zirconium oxide, magnesium oxide, glass, and phosphor, and a sintered body of phosphor with an inorganic bonding material. A refractive index of the filler may be appropriately adjusted, and it is 1.8 or more, for example.

A particle of the filler may have any shape such as a crushed shape, sphere, hollow shape, or porous shape. An average particle diameter (median size) of the particle is preferably 0.08 μm to 10 μm, so that light scattering effect can be obtained with high efficiency.

The phosphor and/or the filler is preferably 10% to 80% by weight with respect to a total weight of the light transmissive member.

A method for disposing the wavelength conversion member in the recess includes potting, compression molding, spraying, and printing. Among them, it is preferable to use the spraying method, particularly, a pulse spraying method in which pulsed spraying, that is, intermittent spraying is performed. By using the intermittent spraying, a sprayed amount of the wavelength conversion member per unit time can be reduced. Therefore, the phosphor can be uniformly applied to the surface with a spray nozzle spraying a small amount of the phosphor while moving at low speed. In addition, as for the pulse spraying method, compared with a continuous spraying method, its air speed can be reduced without reducing spraying speed of slurry from the nozzle. Therefore, the slurry can be preferably supplied to the surface, and the applied slurry is not disturbed by air flow. As a result, it is possible to form a film which can achieve high adhesiveness between the phosphor particles and the surface of the light-emitting element. In addition, the thin film containing the particulate phosphor may be stacked into stacked layers. In this case, by controlling the number of the stacked layers, a thickness of the wavelength conversion member can be provided with high accuracy. In addition, the phosphor distribution can be prevented from becoming uneven, and the light having the converted wavelength can be uniformly emitted, so that color unevenness of the light-emitting device can be prevented from being generated. In this process, silica (aerogel) may be added in order to adjust viscosity or fluidity.

The pulse spraying method is known methods disclosed in, for example, Japanese Unexamined Patent Application Publication No. 61-161175, Japanese Unexamined Patent Application Publication No. 2003-300000, and International Publication No. 2013/038953, and a material to be used and a condition may be appropriately adjusted. For example, the slurry to be applied contains a solvent, a thermosetting resin, and a particulate phosphor. The thermosetting resin includes silicone resin, epoxy resin, and urea resin. The solvent can be an organic solvent composed of n-hexane, n-heptane, toluene, acetone, or isopropyl alcohol. The phosphor content is preferably 10% to 80% by weight. The slurry is preferably adjusted to be 0.01 mPa·s to 1000 mPa·s, and more preferably 0.1 mPa·s to 100 mPa·s.

A thickness of the wavelength conversion member is not limited in particular, and at least one part of the wavelength conversion member can be disposed in the recess in the light transmissive substrate. In order to improve the light extracting efficiency in the front direction, the side surface of the wavelength conversion member is preferably not exposed to the outside, and the upper surface of the wavelength conversion member is preferably lower than the upper surface of the light transmissive substrate. Thus, the light is further prevented from leaking toward the side surface.

The wavelength conversion member may be applied to the upper surface of the light transmissive member before the light-emitting element is mounted on the base member, and then provided in the light-emitting device.

Dimensional Relationship of Light-Emitting Device

Figure 7:
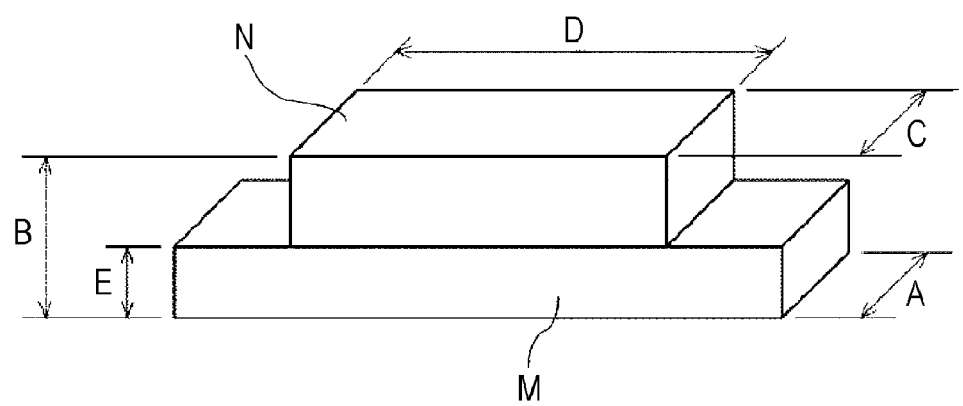
FIG. 7 is a schematic perspective view of a light-emitting device for describing a dimensional relationship in the light-emitting device in the embodiment.

As shown in FIG. 7, from another point of view, the light-emitting device in the present disclosure satisfies the following relationship in a light-emitting element portion (including a light-emitting element, a light reflecting member, and a wavelength conversion member) N mounted on a base member M, $$B \geq A \quad (1),$$

$$D \geq C \quad (2),$$

$$A \geq C \quad (3), \text{ and}$$

$$E \leq A \quad (4), \text{ wherein}$$

E: thickness of base member M,
A: short-side length of base member M,
B: total height of base member M and light-emitting element portion N,
C: short-side length of light reflecting member portion N, and
D: long-side length of light-emitting element portion N.

Satisfying above relationship allows for ensuring stable mounting of the light emitting device in the case where the long-side side surface of the light-emitting device in the present disclosure serves as the mounting surface (that is, in the case of a side surface mounting). Particularly, by satisfying (1), the side surface mounting can be easily performed. In addition, by satisfying (2), the structure of the light emitting device can be more stable in the case of the side surface mounting. By satisfying (3), and by spacing the mounting surface apart from the long-side side surface of the light reflecting member, the solder can be prevented from intruding toward the light-emitting element at the time of mounting. At the same time, the long-side side surface of the base member M can be stably held on the mounting substrate. By satisfying (4), the stable mounting can be implemented. By combining some of the relationships from (1) to (4), the more stable mounting can be implemented.

Furthermore, in order to facilitate the side surface mounting, a through hole may be formed in the base member of the light-emitting device, and a material having a high specific gravity such as metal may be filled in the through hole to eccentrically shift the weight. Furthermore, by controlling the fillet geometry of the solder to use the surface tension of the solder, the side surface mounting can be ensured.

One or more of the above can be appropriately combined.

This light-emitting device is mainly applied to the side-view type light-emitting device which can emit the light to the light guide plate used in the liquid crystal backlight. Therefore, it is important to control the light distribution and enhance the brightness. Consequently, the light can be intensely emitted from the upper surface of the light conversion member in the light-emitting device, so that the light emission suitable for the backlight can be efficiently obtained.

Hereinafter, embodiments of the light-emitting device in the present disclosure will be described specifically with reference to the drawings.

First Embodiment

Figure 2A:
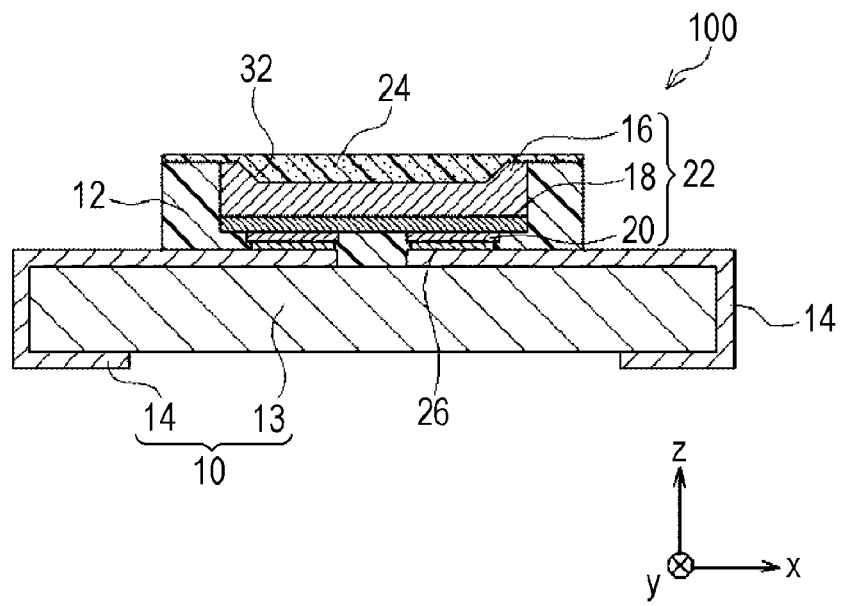
FIG. 2A is a schematic cross-sectional view of the light-emitting device taken along a line A-A' in FIG. 1.

A light-emitting device 100 in this embodiment includes, as shown in FIGS. 1 and 2A, a base member 10 including a base material 13 and a pair of connection terminals 14 formed on a first main surface, a light-emitting element 22, a light reflecting member 12, and a wavelength conversion member 24.

The pair of connection terminals 14 is formed on surfaces of the base material 13, specifically, continuously formed from an upper surface serving as the first main surface to a lower surface serving as a second main surface through an end surface, in the base member 10. The connection terminal 14 is formed by stacking Cu/Ni/Au (total thickness: 20 µm, and coefficient of linear expansion: 20 ppm/° C.) from a side of the base material 13. The base member 10 has a long-side length of 1.8 mm, a short-side width of 0.3 mm, and a thickness of 0.45 mm, and serves as a wiring substrate. The strength of the base member is 300 MPa or more which is measured by a tensile testing machine.

The base material 13 is made of a BT resin composition containing a naphthalene-based epoxy resin containing commercially available glass cloth (for example, HL832NSF type LCA produced by MITSUBISHI GAS CHEMICAL COMPANY, INC.). The base material 13 contains glass fiber, spherical silica, spherical silicone, and carbon, and has a cuboidal shape. A coefficient of linear expansion of the base material 13 (not having the connection terminal) is about 3 ppm/° C., and a glass transition temperature of the resin contained in it is about 280° C.

One light-emitting element 22 is mounted on the connection terminal 14 by flip chip bonding.

The light-emitting element 22 includes a semiconductor layer 18 made of a stacked body of nitride semiconductors (thickness: 8 µm to 12 µm) formed on a light transmissive substrate 16 made of sapphire (thickness: about 150 µm). The light-emitting element has a pair of positive and negative electrodes 20 formed on a surface of the semiconductor layer which is opposite to a surface facing the light transmissive substrate 16. The pair of positive and negative electrodes of the light-emitting element 22 is connected to the pair of connection terminals 14 of the base member 10 with a bonding member 26 (thickness: 20 µm) made of an Au—Sn eutectic solder, respectively. The surface of the light transmissive substrate, which faces the semiconductor layer, has irregularities (height: 0.5 µm, and pitch: 10 µm), so that the semiconductor layer has the same irregularities on its corresponding surface.

The light-emitting element 22 is a cuboidal LED chip emitting blue light (emission peak wavelength: 455 nm) and having a long-side length of 1.1 mm, a short-side width of 0.2 mm, and a thickness of 0.15 mm (a thickness of the light transmissive substrate 16 is 0.14 µm).

A surface roughness Ra of the light-emitting element 22 on its side surface is 1.0 µm or less.

A recess 32 which is provided for disposing the wavelength conversion member 24 is formed in the surface of the light transmissive substrate 16, which is opposite to the surface having the semiconductor layer 18, that is, in the surface serving as an upper surface of the light transmissive substrate when the light-emitting element 22 is disposed on the base member 10.

Figure 2B:
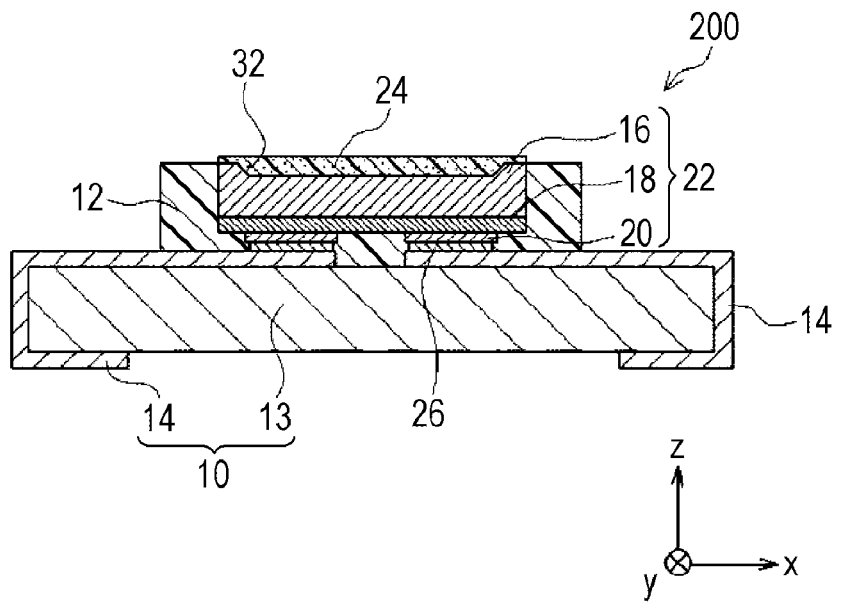
FIG. 2B is a schematic cross-sectional view of a light-emitting device showing a variation of the light-emitting device according to the first embodiment.

A depth of the recess 32 is 50 µm, and an inner surface of the recess 32 is inclined so as to widen upward as shown in FIG. 2B.

The light reflecting member 12 is formed into an approximately cuboidal shape having a long-side length (whole length) of 1.2 mm, a short-side width (whole length) of 0.3 mm, and a thickness of 0.15 mm. That is, each edge portion along the long-side direction of the light reflecting member 12 aligns with each edge portion along the long-side direction of the base member 10.

The light reflecting member 12 is provided on the first main surface of the base member 10 so as to be in contact with the light-emitting element 22 to contiguously cover a whole periphery of the side surface of the light-emitting element 22. In addition, the light reflecting member 12 is also provided on the surface of the light-emitting element 22 which is opposite to the surface having the light transmissive substrate 16. That is, the light reflecting member 12 is provided between the light-emitting element 22 and the bonding member 26, and approximately completely covers the surface of the bonding member 26. Furthermore, the light reflecting member 22 may be also provided between the light-emitting element 22 and the base member 10.

Thus, the light can be efficiently extracted from the light-emitting element 22 to an upper surface of the light emitting device. In addition, since the light reflecting member 12 is also provided between the light-emitting element 22 and the base member 10, the light-emitting element 22 can be more strongly connected to the base member 10.

An upper surface of the light reflecting member 12 is approximately flush with the upper surface of the light-emitting element 22, that is, an upper surface of the light transmissive substrate 16.

The light reflecting member 12 is made of a silicone resin containing silica having an average particle diameter of 14 µm, and titanium oxide, as inorganic particles, having an average diameter of 0.25 µm to 0.3 µm, by 2 wt. % to 2.5 wt. % and 40 wt. % to 50 wt. %, respectively with respect to a total weight of the light reflecting member 12. A glass transition temperature of the silicone resin is 40° C., and a coefficient of linear expansion thereof is 50 ppm/° C.

The edge portion of the light reflecting member 12 along the long-side direction aligns with the edge portion of the base member 10 along the long-side direction, and an end surface of the light reflecting member 12 in the long-side direction is on the same plane as an end surface of the base member 10 along the long-side direction.

The wavelength conversion member 24 is disposed in the recess 32 formed in the upper surface of the light-emitting element 22, that is, in the surface opposite to the surface having the pair of positive and negative electrodes 20. The wavelength conversion member 24 is formed such that the recess 32 is filled with a silicone resin containing a phosphor of YAG:Ce having a center particle diameter of about 8 vim, by using a spraying method.

The wavelength conversion member 24 may cover not only the recess 32 but also the upper surface of the light reflecting member 12. According to this embodiment, as shown in FIG. 2A, an end surface of the wavelength conversion member 24 aligns with an end surface of the light reflecting member 12. A thickness of the wavelength conversion member 24 which covers the upper surface of the light reflecting member 12 is as thin as about 15 µm, so that the light can be hardly guided in the lateral direction.

According to the light-emitting device with such configuration, since the wavelength conversion member 24 is mostly disposed in the recess 32 formed in the light transmissive substrate 16, the light reflecting member 12 covering the side surfaces of the light transmissive substrate 16 is disposed to surround the side surface of the wavelength conversion member 24 disposed in the recess 32. Thus, the light can be prevented from leaking toward the side surface of the light emitting device, so that the light extraction efficiency from the front surface of the light emitting device can be enhanced.

In the light-emitting device 100, as shown in FIGS. 1 and 2A, each of the pair of end surfaces of the base member 10 along the long-side direction and each of the pair of end surfaces of the light reflecting member 12 along the long-side direction are disposed so as to be on the same plane. In addition, FIG. 2A is a schematic cross-sectional view taken along a line A-A' in FIG. 1. One of these end surfaces on the same plane is mounted to a secondary mounting substrate, as the mounting surface of the side-view type light-emitting device 100.

Figure 8A:
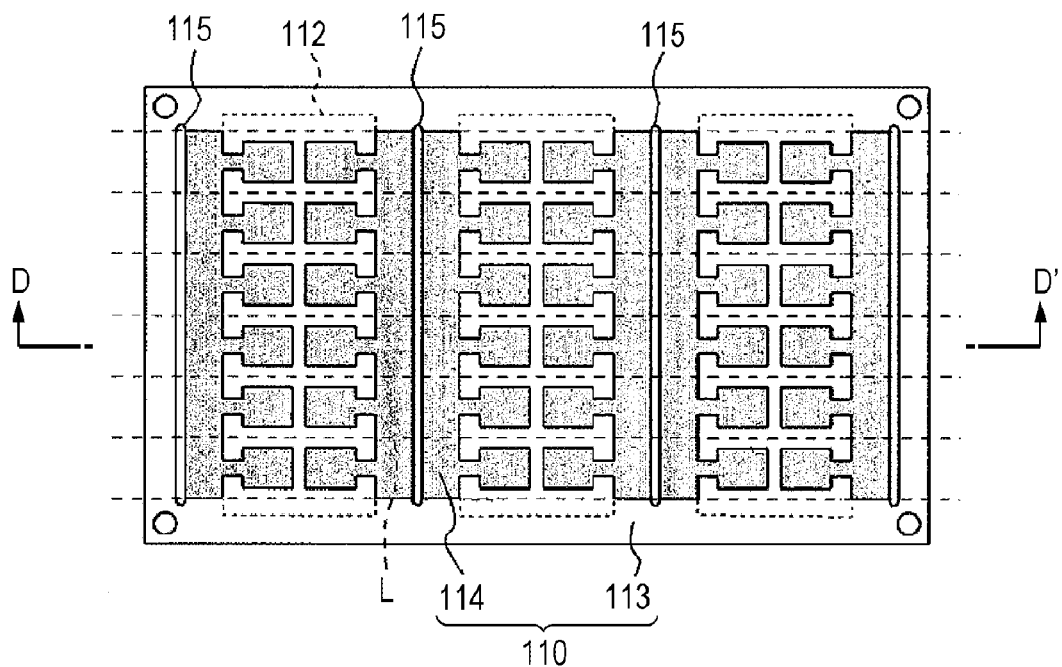
FIG. 8A is a schematic plan view for describing a method for manufacturing the light-emitting device in FIG. 1.
Figure 8B:
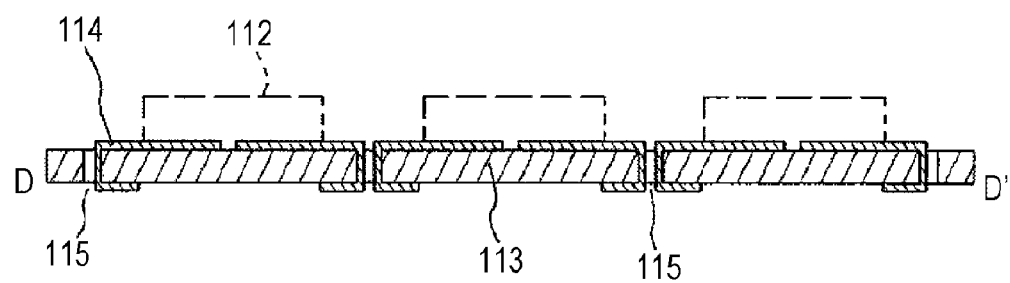
FIG. 8B is a schematic cross-sectional view taken along a line D-D' in FIG. 8A.

The above light-emitting device 100 can be manufactured using a composite base member 110 in which a composite connection terminal 114 is disposed on a base material 113, as shown in FIGS. 8A and 8B. FIG. 8B is a schematic cross-sectional view taken along a line D-D' in FIG. 8A. The composite base member 110 includes a series of components each of which will become the base member in the light-emitting device after a singulating step as described below.

The composite base member 110 has slits 115 each penetrating the base material 113 from an upper surface to a lower surface. The composite connection terminal 114 is continuously provided from the upper surface to the lower surface of the base material 113 in the composite base member 110 through inner walls of the slits 115.

FIGS. 8A and 8B show the composite base member 110 for obtaining 18 light-emitting devices, but the composite base member 110 may be used for obtaining more (several hundred to several thousand) light-emitting devices in view of production efficiency.

The light-emitting elements 22 are connected to the composite base member 110, and a plurality of light reflecting members 112 are collectively molded by transfer molding so as to cover the end surfaces of the light-emitting elements 22, and then the molded body is taken out.

Subsequently, a portion of an upper surface of the composite base member 110 exposed from the light reflecting member is covered with a mask, and then the wavelength conversion member 24 is formed by, for example, a pulse spraying method on the recesses 32 in the upper surfaces of the light-emitting elements 22 exposed from the upper surfaces of the light reflecting members 112, and on the upper surfaces of the light transmissive substrates 16 and on the upper surfaces of the light reflecting members 112, which are provided outside the recess. Subsequently, the composite base member 110 and the light reflecting members 112 are cut in one direction along predetermined split lines L. Subsequently, they are separated along extending directions of the disposed slits 115, so that the light-emitting devices can be singulated with the relatively small number of steps.

The cutting may be performed with a dicer or laser.

In addition, according to this embodiment, the wavelength conversion member 24 is formed on the upper surface of the light-emitting element 22 and the upper surface of the light reflecting member 12 by the pulse spraying method, but the wavelength conversion member 24 may be knitted only on the upper surface of the light-emitting element 22.

Furthermore, the wavelength conversion member is continuously formed from the upper surface of the light-emitting element 22 to the upper surface of the light reflecting member 12 in this embodiment, but it may be discontinuously formed. Thus, even when the wavelength conversion member is formed on the upper surface of the light reflecting member 12, the light can be prevented from being guided from a portion of the wavelength conversion member on the upper surface of the light-emitting element 22 to a portion of the wavelength conversion member on the upper surface of the light reflecting member 12.

First Variation of First Embodiment

As shown in FIG. 2Bb, The light emitting device according to a first variation of the first embodiment has substantially the same configuration as that of the light-emitting device in the first embodiment except that the position of the wavelength conversion member 24 in the light-emitting device shown in the schematic cross-sectional view of the light-emitting device in FIG. 2A is changed to a position in which the wavelength conversion member 24 is disposed only on the upper surface of the light-emitting element 22 as shown in FIG. 2B.

As shown in FIG. 2B, the wavelength conversion member 24 in a light-emitting device 200 is formed in the recess 32 of the light transmissive substrate 16 and on the upper surface of the light transmissive substrate 16 outside the recess, but not formed on the upper surface of the light reflecting member 12. The light reflecting member 12 is formed so as to be in approximately the same plane as the upper surface of the light transmissive substrate 16, and the upper surface of the wavelength conversion member 24 is at higher position than the upper surface of the light reflecting member 12 by a thickness of the wavelength conversion member 24 formed on the light transmissive substrate 16.

Since the wavelength conversion member 24 is not disposed on the upper surface of the light reflecting member 12, that is, the wavelength conversion member 24 is not in contact with, but is spaced apart from the light reflecting member 12, the light can be further prevented from leaking toward the side surface.

Second Variation of First Embodiment

Figure 2C:
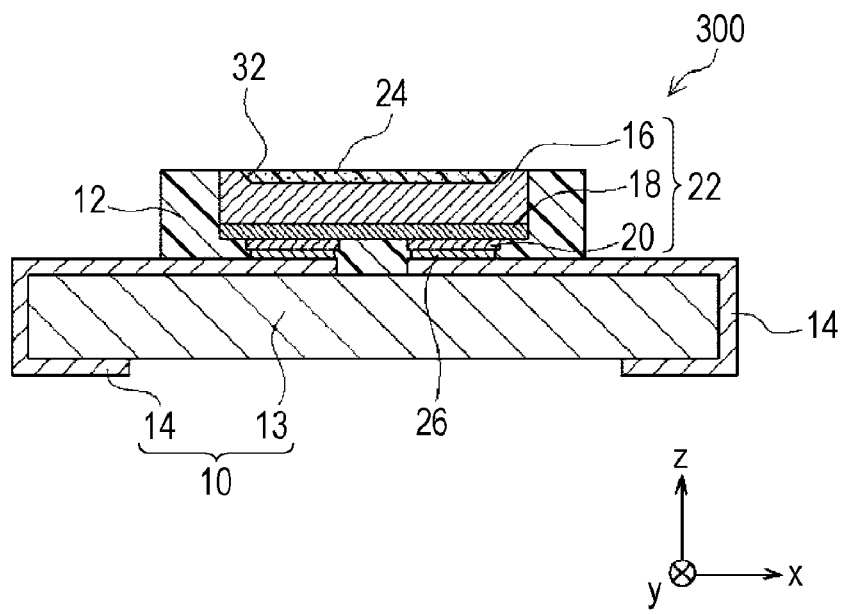
FIG. 2C is a schematic cross-sectional view of a light-emitting device showing a variation of the light-emitting device according to the first embodiment.

The light emitting device according to a second variation of first embodiment has substantially the same configuration as that of the light-emitting device in the first embodiment except that the position of the wavelength conversion member 24 in the light-emitting device shown in the schematic cross-sectional view of the light-emitting device in FIG. 2A is changed to a position in which the wavelength conversion member 24 is disposed only in the recess 32 in the upper surface of the light-emitting element 22 as shown in FIG. 2C. According to a light-emitting device 300, since the wavelength conversion member 24 is completely buried in the recess 32, the wavelength conversion member 24 does not project from the light reflecting member 12 in the height direction (Z direction), and is embedded in the light reflecting member. Therefore, the light can be further prevented from leaking toward the side surface.

Third Variation of First Embodiment

Figure 2D:
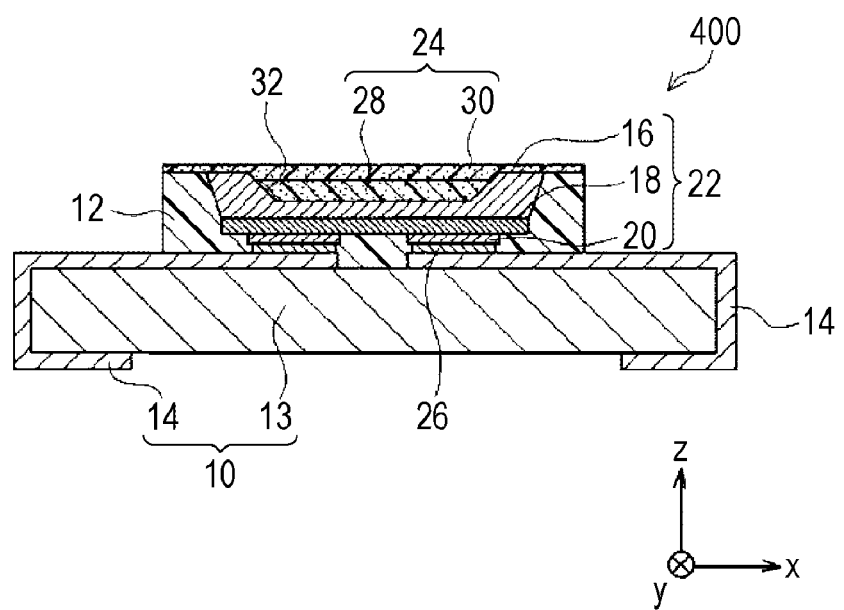
FIG. 2D is a schematic cross-sectional view of a light-emitting device showing a variation of the light-emitting device according to the first embodiment.

The light emitting device according to a third variation 3 of first embodiment has substantially the same configuration as that of the light-emitting device in the first embodiment except that the wavelength conversion member 24 in the light-emitting device shown in the schematic cross-sectional view of the light-emitting device in FIG. 2A includes a plurality of layers as shown in FIG. 2D. In a light-emitting device 400, the wavelength conversion member 24 is formed by sequentially laminating a first wavelength conversion member 28 and a second wavelength conversion member 30. The whole first wavelength conversion member 28 is disposed in the recess 32 formed in the upper surface of the light transmissive substrate 16, and the second wavelength conversion member 30 is disposed so as to cover an upper surface of the first wavelength conversion member 28. The second wavelength conversion member 30 covers the upper surface of the light transmissive substrate 16 and the upper surface of the light reflecting member 12, and partially in the recess 32.

Second Embodiment

Figure 3:
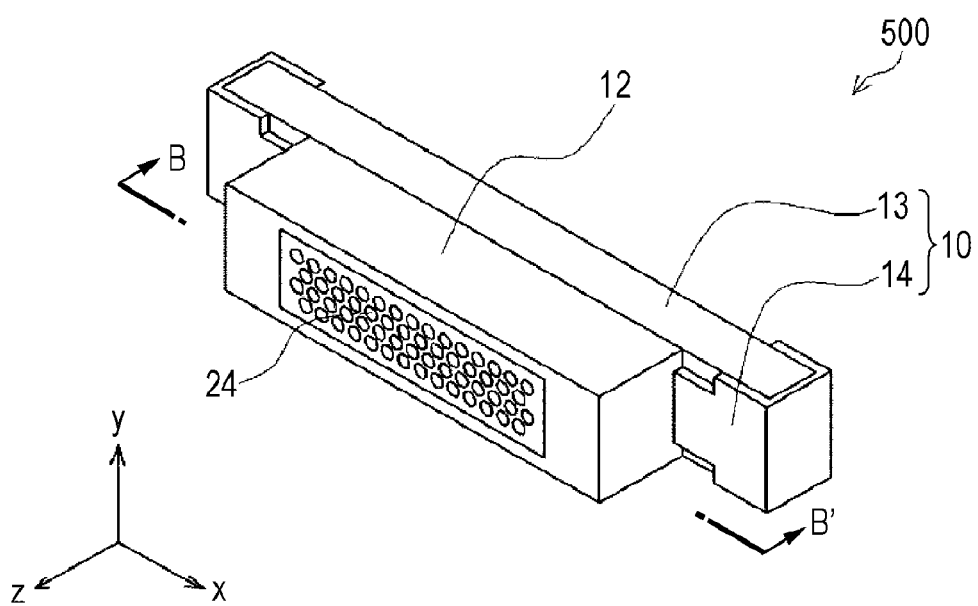
FIG. 3 is a schematic perspective view of a light-emitting device according to a second embodiment.
Figure 4:
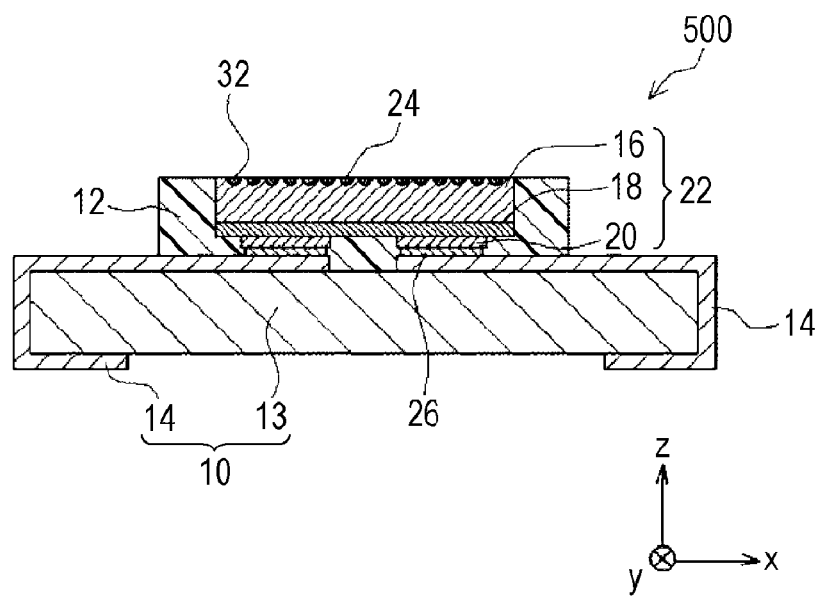
FIG. 4 is a schematic cross-sectional view taken along a line B-B' in FIG. 3.

According to a light-emitting device 500 in this embodiment, as shown in FIG. 3 and FIG. 4 which is a schematic cross-sectional view taken along a line B-B' in FIG. 3, a plurality of holes are formed in the upper surface of the light transmissive substrate 16, and these holes serve as recesses 32. That is, according to this embodiment, the plurality of recesses 32 are formed in the upper surface of the light transmissive substrate 16, and the wavelength conversion member 24 is formed so as to fill the recesses 32.

A planar shape of the recess (shape of an opening of the recess) may be any shape such as a circle, quadrangle, ellipsoid, or polygon.

The plurality of the recesses 32 may be uniformly disposed or non-uniformly disposed in the upper surface of the light transmissive substrate 16. Uniformly disposing the recess allows for reducing color unevenness. In the case where the wavelength conversion member has particles such as phosphor, a size of each of the recesses is to be larger than a diameter of the particle.

Other than the above configuration, substantially the same configuration as that of the light reflecting member in the first embodiment is provided. Thus, similar effect as in the first embodiment can be provided.

Third Embodiment

Figure 5:
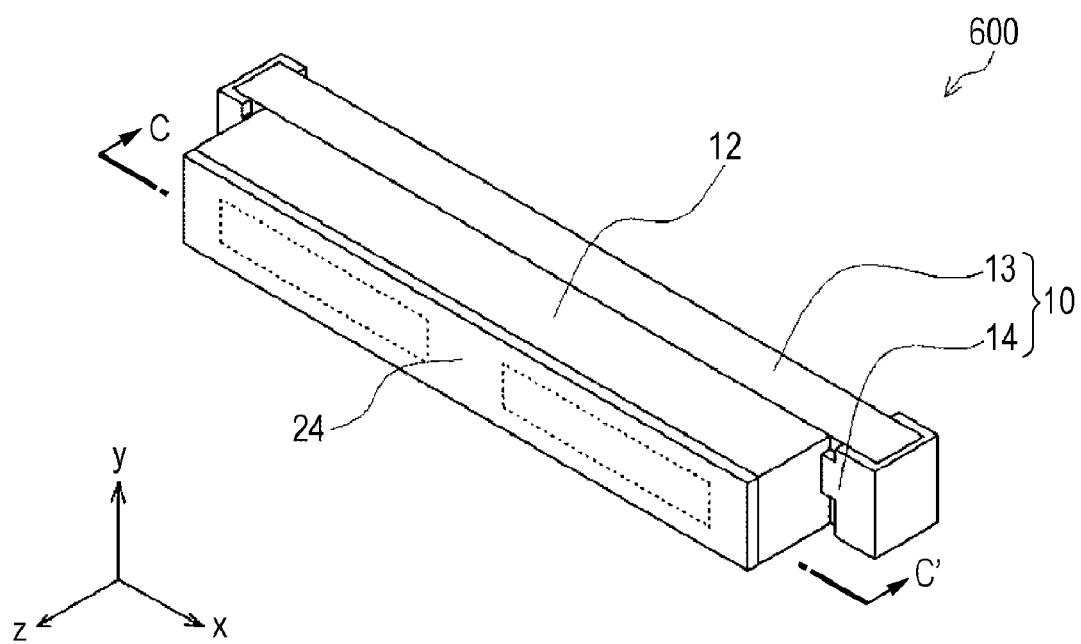
FIG. 5 is a schematic perspective view of a light-emitting device according to a third embodiment.
Figure 6:
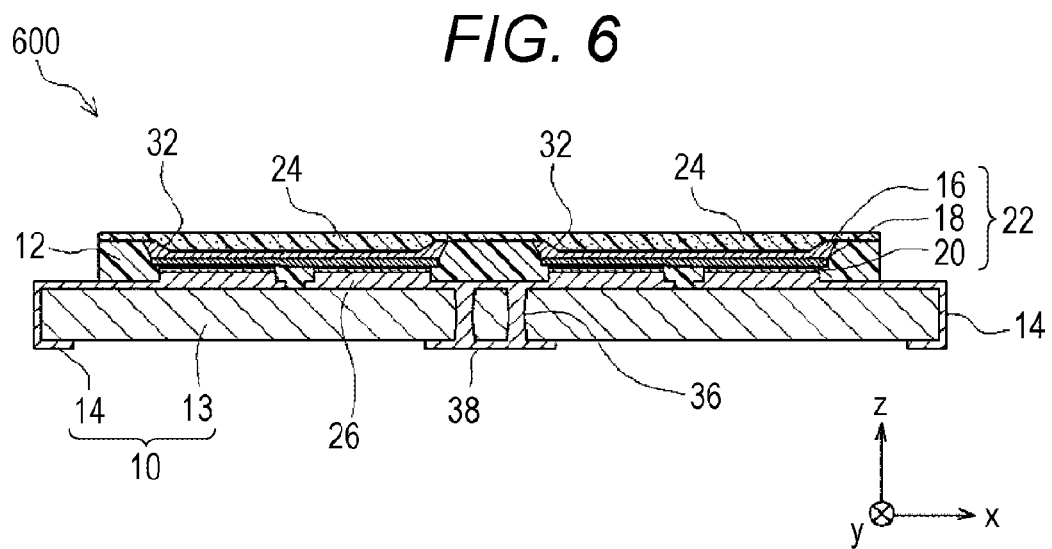
FIG. 6 is a schematic cross-sectional view taken along a line C-C' in FIG. 5.

According to a light-emitting device 600 in this embodiment, as shown in FIG. 5 and FIG. 6 which is a cross-sectional view taken along a line C-C' in FIG. 5, a plurality of light-emitting elements 22 are mounted on the base member 10. The two planarly quadrangular light-emitting elements 22 are disposed in the light-emitting device 600 in a long-side direction of the base member so that short-side ends of the respective light-emitting elements 22 face each other. The light reflecting member 12 is disposed between the light-emitting element 22 and the adjacent light-emitting element 22, so that the light from the one light-emitting element is less likely to be absorbed by the other light-emitting element.

The recess 32 formed in each of the light-emitting elements 22 is formed similarly to the first embodiment, and the wavelength conversion member 24 is also formed on the upper surface of the light reflecting member 12 formed between the light-emitting element and the light-emitting element. Thus, the light can be guided to a region between the two light-emitting elements, so that a dark portion can be prevented from being generated between the light-emitting elements.

Furthermore, the light-emitting device 600 further includes a heat releasing terminal 38 provided below an area between the light-emitting elements 22, other than one pair of connection terminals 14. The heat releasing terminal 38 is connected to the one pair of connection terminals 14 through vias 36, so that the heat of the light-emitting element 22 can be released.

Other than the above configuration, substantially the same configuration as the light reflecting member in the first embodiment can be provided. Thus, similar effect as in the first embodiment can be provided.

A light-emitting device according to an aspect of the present disclosure includes a light-emitting element having a light transmissive substrate and a semiconductor layer, a base member on which the light-emitting element is disposed with the light transmissive substrate facing upward, a recess formed in an upper surface of the light transmissive substrate, a wavelength conversion member disposed in the recess, and a light reflecting member to cover a side surface of the light transmissive substrate.

According to the present disclosure, due to the above characteristics, it is possible to provide the light-emitting device capable of preventing light from leaking from the side surface, and extracting the light from a front surface with high efficiency.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:
   a first light-emitting element comprising:
      a semiconductor layer having a semiconductor upper surface and a semiconductor lower surface opposite to the semiconductor upper surface;
      a light transmissive substrate having a substrate upper surface, a substrate lower surface opposite to the substrate upper surface, and a substrate side surface between the substrate upper surface and the substrate lower surface, the light transmissive substrate being provided on the semiconductor layer so that the substrate lower surface contacts the semiconductor upper surface of the semiconductor layer; and
      a recess provided on the substrate upper surface of the light transmissive substrate;
   a wavelength conversion member provided in the recess;
   a first electrode provided on the semiconductor lower surface;
   a second electrode provided on the semiconductor lower surface separately from the first electrode; and
   a light reflecting member provided to cover the substrate side surface of the light transmissive substrate and provided between the first electrode and the second electrode.

2. The light-emitting device according to claim 1, wherein the light reflecting member comprises a resin containing a light reflecting material.

3. The light-emitting device according to claim 1, wherein the wavelength conversion member contains two or more kinds of phosphors.

4. The light-emitting device according to claim 1,
wherein the wavelength conversion member contains a KSF-based phosphor.

5. The light-emitting device according to claim 1,
wherein the recess has an inclined inner surface.

6. The light-emitting device according to claim 1,
wherein the light transmissive substrate comprises sapphire.

7. The light-emitting device according to claim 1,
wherein the wavelength conversion member is spaced apart from the light reflecting member.

8. The light-emitting device according to claim 1,
wherein the recess comprises a plurality of recesses.

9. The light-emitting device according to claim 1, further comprising a base on which the first light-emitting element is provided,
wherein the first light-emitting element is provided on the base via a bonding member, and
wherein the semiconductor layer is provided on the base via the bonding member.

10. The light-emitting device according to claim 1,
wherein the wavelength conversion member covers an upper surface of the light reflecting member.

11. The light-emitting device according to claim 1,
wherein the light reflecting member directly contacts with the first light-emitting element.

12. The light-emitting device according to claim 1, further comprising a second light-emitting element,
wherein the light reflecting member is provided between the first light-emitting element and the second light-emitting element.

13. The light-emitting device according to claim 1, further comprising a base on which the first light-emitting element is provided,
wherein the light reflecting member is provided between the first light-emitting element and the base.

14. The light-emitting device according to claim 1,
wherein a depth of the recess is 30 μm to 150 μm.

15. The light-emitting device according to claim 1, further comprising:
a base on which the first light-emitting element is provided; and
a second light-emitting element provided on the base,
wherein the light reflecting member is provided between the first light-emitting element and the base, and
wherein the light reflecting member is provided between the second light-emitting element and the base.

16. The light-emitting device according to claim 15,
wherein the light reflecting member is provided between the first light-emitting element and the second light-emitting element.

* * * * *